(12) United States Patent
Lee et al.

(10) Patent No.: US 12,080,659 B2
(45) Date of Patent: Sep. 3, 2024

(54) SENSOR PACKAGE STRUCTURE

(71) Applicant: KINGPAK TECHNOLOGY INC., Hsin-Chu County (TW)

(72) Inventors: Chien-Chen Lee, Hsin-Chu County (TW); Li-Chun Hung, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 295 days.

(21) Appl. No.: 17/715,924

(22) Filed: Apr. 7, 2022

(65) Prior Publication Data
US 2023/0230939 A1 Jul. 20, 2023

(30) Foreign Application Priority Data
Jan. 18, 2022 (TW) .................................. 111101915

(51) Int. Cl.
*H01L 23/60* (2006.01)
*H01L 23/492* (2006.01)
*H01L 23/552* (2006.01)

(52) U.S. Cl.
CPC ............ *H01L 23/60* (2013.01); *H01L 23/492* (2013.01); *H01L 23/552* (2013.01)

(58) Field of Classification Search
CPC ...... H01L 23/60; H01L 23/492; H01L 23/552
See application file for complete search history.

(56) References Cited

U.S. PATENT DOCUMENTS

| | | | |
|---|---|---|---|
| 2012/0211852 A1* | 8/2012 | Iwafuchi | H01L 27/14649 257/435 |
| 2015/0264231 A1* | 9/2015 | Murayama | H01L 27/14625 348/308 |
| 2018/0355088 A1* | 12/2018 | Ogawa | C09D 5/32 |
| 2019/0057992 A1* | 2/2019 | Chen | H01L 27/14636 |
| 2020/0119070 A1* | 4/2020 | Yang | H01L 27/14636 |
| 2021/0305437 A1* | 9/2021 | Liu | H01L 27/14618 |
| 2022/0020800 A1* | 1/2022 | Hsieh | H01L 27/14625 |

* cited by examiner

*Primary Examiner* — Peniel M Gumedzoe
(74) *Attorney, Agent, or Firm* — Li & Cai Intellectual Property Office

(57) ABSTRACT

A sensor package structure is provided. The sensor package structure includes a substrate, a sensor chip disposed on the substrate, a light-curing layer disposed on the substrate and surrounding the sensor chip, a light-permeable layer disposed on the light-curing layer, and a shielding layer that is ring-shaped and that is disposed on the light-permeable layer. And inner surface of the light-permeable layer, the light-curing layer, and the substrate jointly define an enclosed space that accommodates the sensor chip. A first projection area defined by orthogonally projecting the shielding layer onto the inner surface does not overlap the assembling region. A second projection area defined by orthogonally projecting the sensing region onto the inner surface along the predetermined direction does not overlap the first projection area and is located inside of the first projection area.

7 Claims, 9 Drawing Sheets

SENSOR PACKAGE STRUCTURE

CROSS-REFERENCE TO RELATED PATENT APPLICATION

This application claims the benefit of priority to Taiwan Patent Application No. 111101915, filed on Jan. 18, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a package structure, and more particularly to a sensor package structure.

BACKGROUND OF THE DISCLOSURE

A conventional sensor package structure is formed by disposing a glass board onto a sensor chip through an adhesive, and the adhesive is arranged around a sensing region of the sensor chip. However, light passing through the glass board may be partially reflected by the adhesive, so that the sensing region of the sensor chip may be affected by the reflected light (e.g., a flare phenomenon).

Accordingly, the glass board and the adhesive of the conventional sensor package structure are provided with a shielding layer there-between so as to reduce the flare phenomenon. However, a delamination issue can easily occur in any part of the shielding layer embedded in the adhesive.

SUMMARY OF THE DISCLOSURE

In response to the above-referenced technical inadequacies, the present disclosure provides a sensor package structure to effectively improve on the issues associated with conventional sensor package structures.

In one aspect, the present disclosure provides a sensor package structure, which includes a substrate, a sensor chip, a light-curing layer, a light-permeable layer, and a shielding layer. The sensor chip is disposed on the substrate along a predetermined direction. The sensor chip is electrically coupled to the substrate, and a top surface of the sensor chip has a sensing region. The light-curing layer is ring-shaped, and the light-curing layer is disposed on the substrate and surrounds the sensor chip. The light-permeable layer has an outer surface and an inner surface. The inner surface has an assembling region being ring-shaped. The assembling region of the light-permeable layer is disposed on the light-curing layer, and the light-permeable layer is located above the sensor chip. The inner surface of the light-permeable layer, the light-curing layer, and the substrate jointly define an enclosed space, and the sensor chip is arranged in the enclosed space. The shielding layer is ring-shaped and is disposed on the light-permeable layer so as to block a visible light from passing there-through. Moreover, a first projection area defined by orthogonally projecting the shielding layer onto the inner surface along the predetermined direction does not overlap the assembling region, and a second projection area defined by orthogonally projecting the sensing region onto the inner surface along the predetermined direction does not overlap the first projection area and is located inside of the first projection area.

Therefore, the sensor package structure provided by the present disclosure can simultaneously have or achieve a plurality of technical effects through the structural cooperation of the components thereof (e.g., under the premise that the shielding layer is used to block visible light for reducing the flare phenomenon caused by light reflected from the light-curing layer, the shielding layer does not affect a curing process of the light-curing layer, and delamination does not occur between the shielding layer and the light-curing layer, thereby effectively increasing the production yield of the sensor package structure).

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
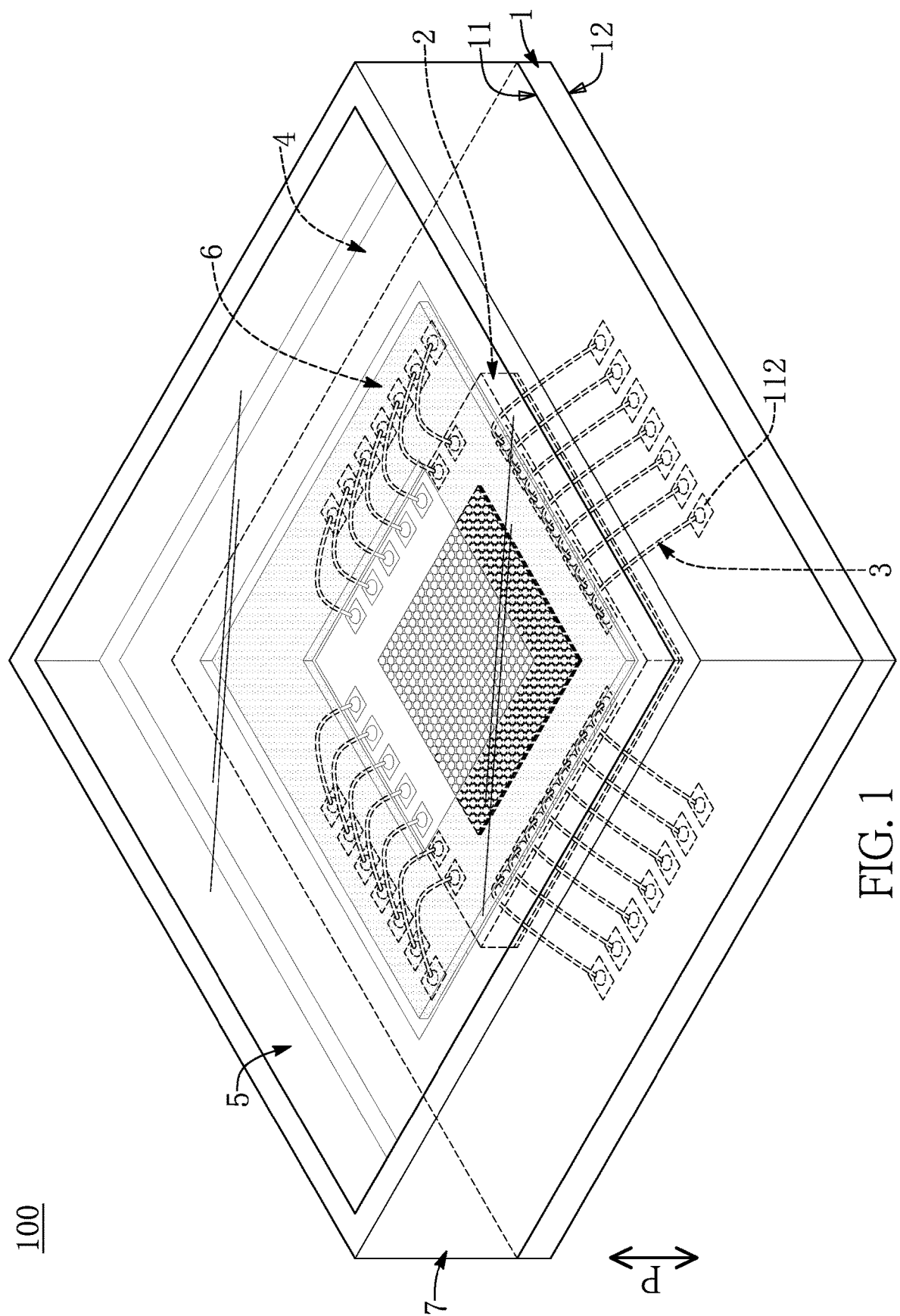
FIG. 1 is a perspective view of a sensor package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
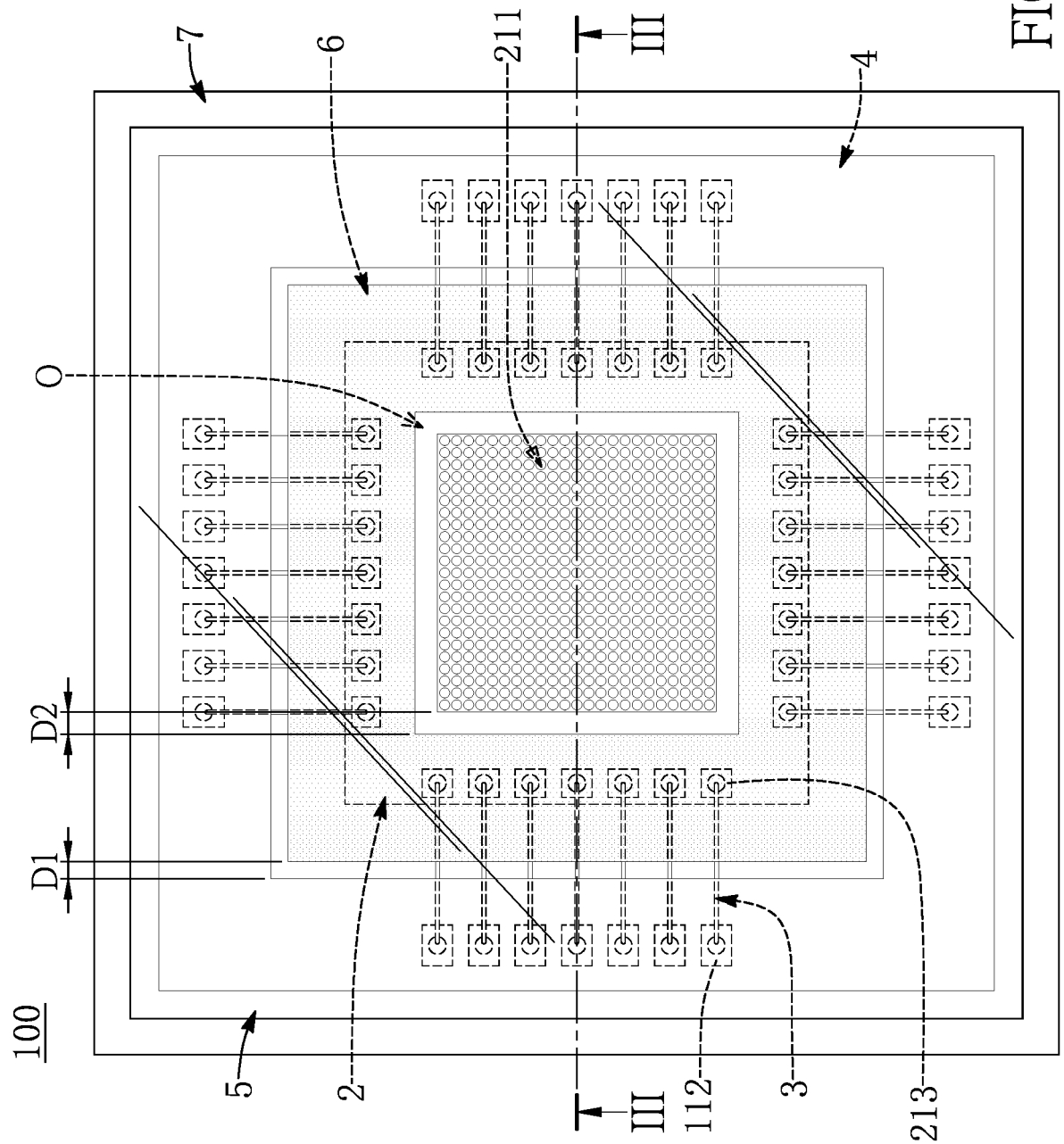
FIG. 2 is a top view of FIG. 1.

Referring to FIG. 1 to FIG. 5, a first embodiment of the present disclosure is provided. As shown in FIG. 1 and FIG. 2, the present embodiment provides a sensor package structure 100. In other words, any package structure not encapsulating a sensor chip therein has a structural design different from that of the sensor package structure 100 of the present embodiment.

Figure 3:
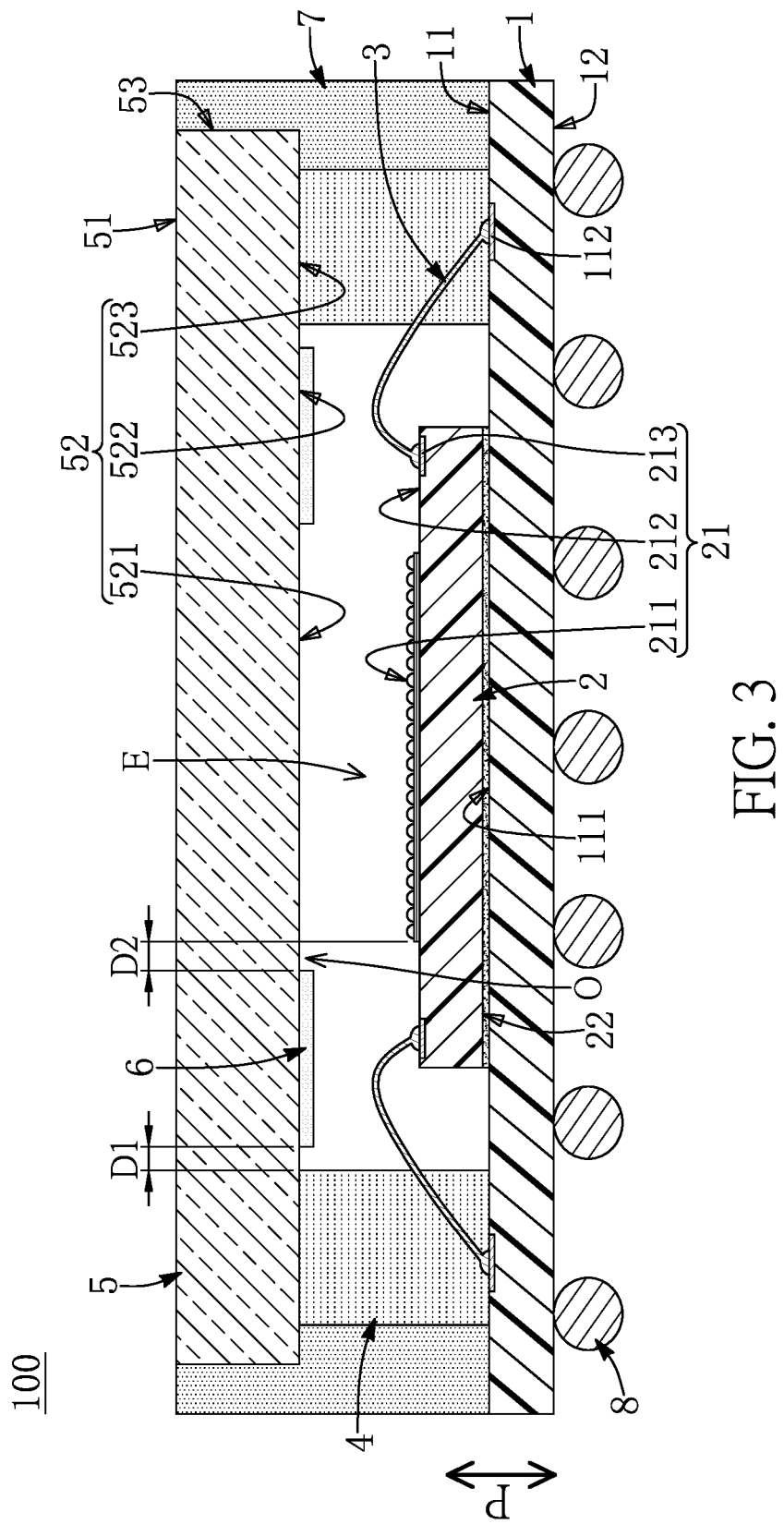
FIG. 3 is a cross-sectional view taken along line III-III of FIG. 2.
Figure 4:
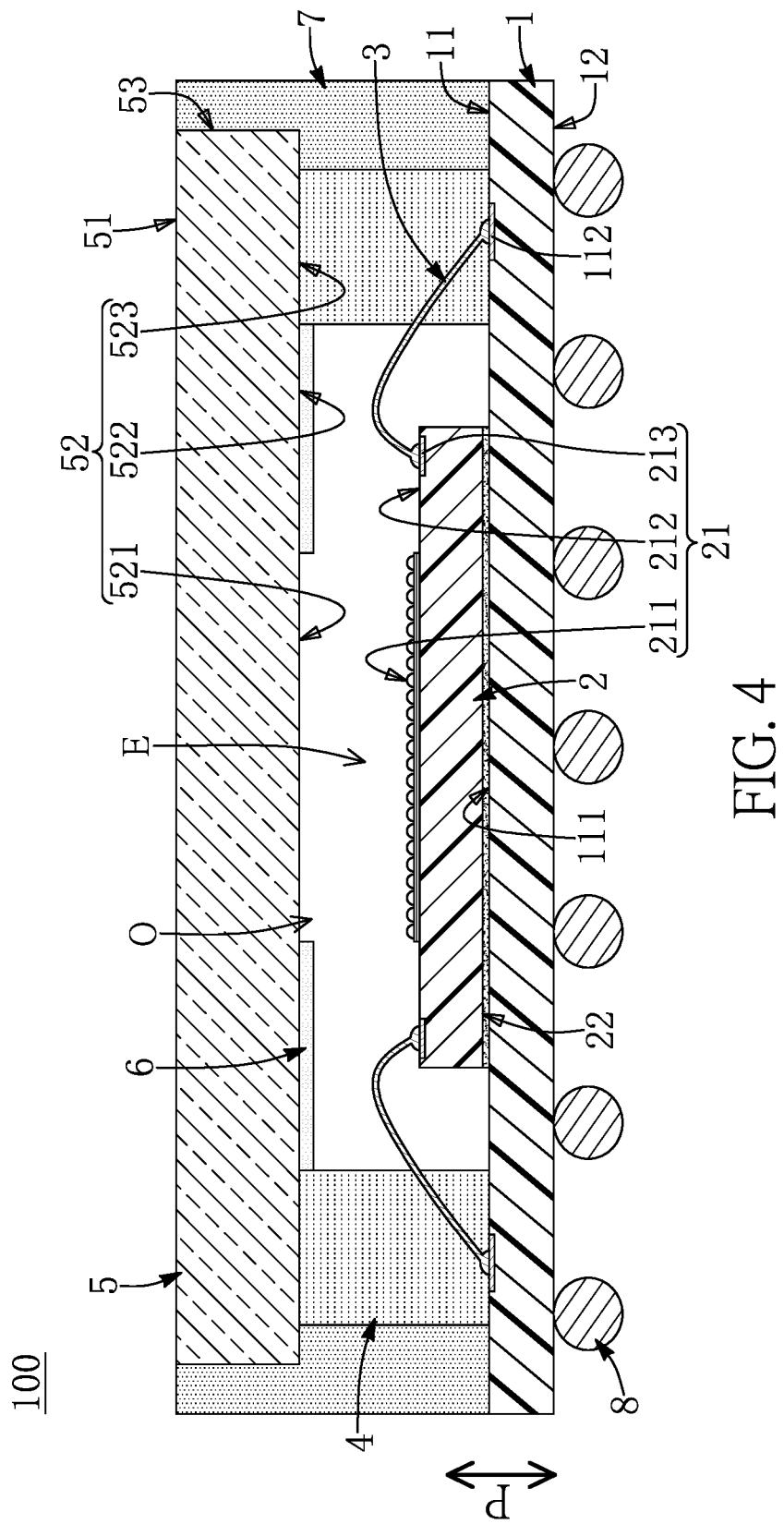
FIG. 4 is a cross-sectional view showing the sensor package structure in another configuration according to the first embodiment of the present disclosure.

As shown in FIG. 2 to FIG. 4, the sensor package structure 100 includes a substrate 1, a sensor chip 2 disposed on the substrate 1, a plurality of metal wires 3 electrically coupled to the sensor chip 2 and the substrate 1, a light-curing layer 4 disposed on the substrate 1, a light-permeable layer 5 disposed on the light-curing layer 4, a shielding layer 6 disposed on the light-permeable layer 5, and a package body 7 that is formed on the substrate 1.

The sensor package structure 100 in the present embodiment includes the above components, but can be adjusted or changed according to design requirements. For example, in other embodiments of the present disclosure not shown in the drawings, the sensor package structure 100 can be provided without the metal wires 3, and the sensor chip 2 is fixed onto and electrically coupled to the substrate 1 in a flip-chip manner; or, the package body 7 of the sensor package structure 100 can be omitted or can be replaced by other components. The following description describes the structure and connection relationship of each component of the sensor package structure 100.

The substrate 1 of the present embodiment is in a square-shape or a rectangular shape, but the present disclosure is not limited thereto. An upper surface 11 of the substrate 1 includes a chip-bonding region 111 arranged approximately on a center portion thereof, and the substrate 1 includes a plurality of soldering pads 112 that are disposed on the upper surface 11 and that are arranged outside of the chip-bonding region 111 (or the sensor chip 2). The soldering pads 112 in the present embodiment are substantially in a ring-shaped arrangement, but the present disclosure is not limited thereto. For example, in other embodiments of the present disclosure not shown in the drawings, the soldering pads 112 can be arranged in two rows respectively at two opposite sides of the chip-bonding region 111.

In addition, the substrate 1 can be further provided with a plurality of solder balls 8 disposed on a lower surface 12 thereof. The sensor package structure 100 can be soldered onto an electronic component (not shown in the drawings) through the solder balls 8, thereby electrically connecting the sensor package structure 100 to the electronic component.

The sensor chip 2 in the present embodiment is an image sensing chip, but the present disclosure is not limited thereto. A bottom surface 22 of the sensor chip 2 is fixed onto the chip-bonding region 111 of the substrate 1 along a predetermined direction P. In other words, the sensor chip 2 is arranged to be surrounded on the inside of the soldering pads 112. Moreover, a top surface 21 of the sensor chip 2 has a sensing region 211 and a carrying region 212 that has a ring-shape arranged around the sensing region 211. The sensor chip 2 includes a plurality of connection pads 213 arranged on the carrying region 212. In other words, the connection pads 213 are arranged outside of the sensing region 211.

The number and positions of the connection pads 213 of the sensor chip 2 in the present embodiment correspond to those of the soldering pads 112 of the substrate 1. Each of the metal wires 3 has a first end and a second end, the first ends of the metal wires 3 are respectively connected to the soldering pads 112, and the second ends of the metal wires 3 are respectively connected to the connection pads 213 (i.e., two opposite ends of each of the metal wires 3 are respectively connected to one of the soldering pads 112 and the corresponding connection pad 213), so that the substrate 1 and the sensor chip 2 can be electrically coupled to each other through the metal wires 3.

The light-curing layer 4 is ring-shaped, and the light-curing layer 4 on the substrate 1 is located outside of the chip-bonding region 111 and surrounds the sensor chip 2. The light-curing layer 4 in the present embodiment is not in contact with the sensor chip 2, thereby enabling the sensor package structure 100 to encapsulate any kind of the sensor chip 2. In other words, any adhesive layer being in contact with the sensor chip 2 is different from the light-curing layer 4 of the present embodiment.

Figure 5:
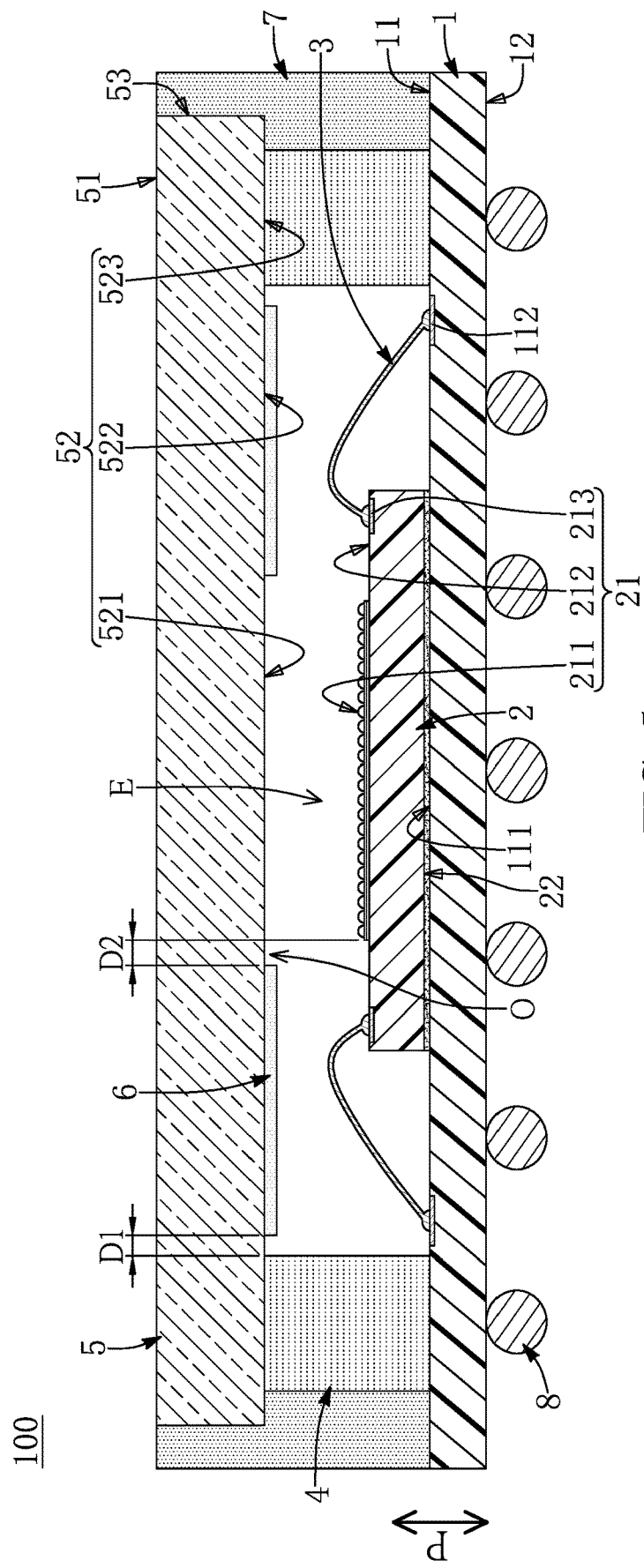
FIG. 5 is a cross-sectional view showing the sensor package structure in still another configuration according to the first embodiment of the present disclosure.
Figure 6:
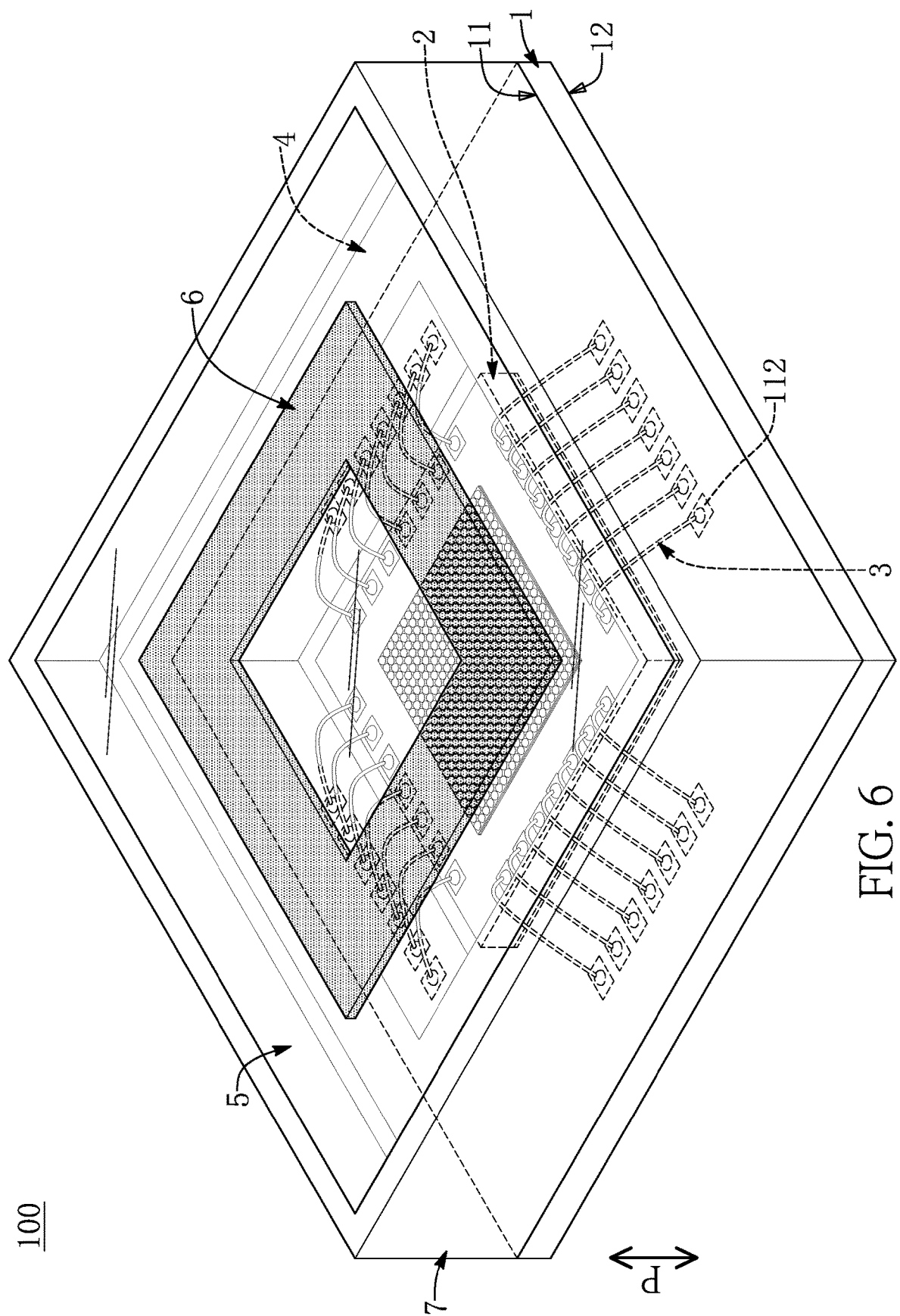
FIG. 6 is a perspective view of the sensor package structure according to a second embodiment of the present disclosure.
Figure 7:
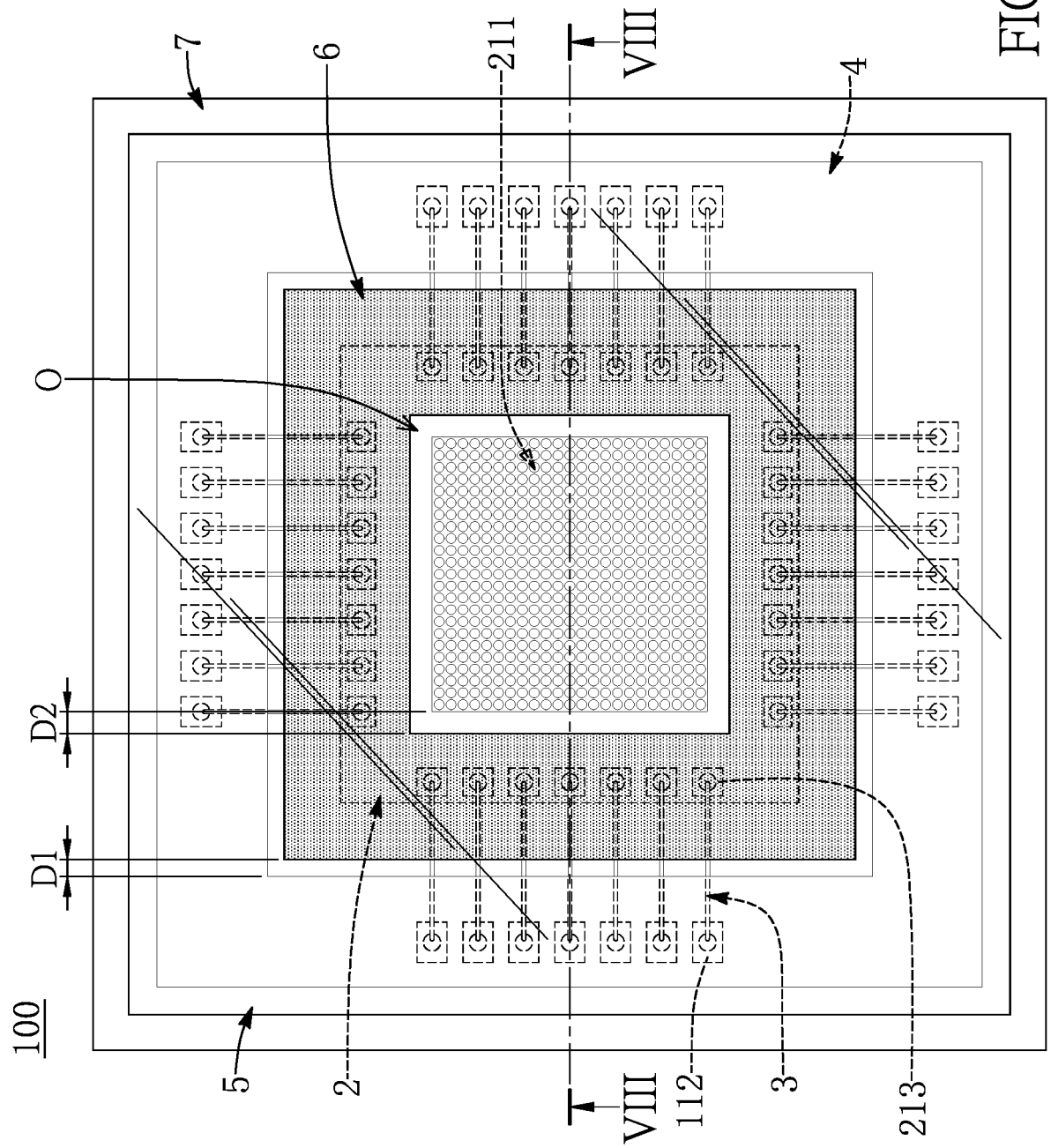
FIG. 7 is a top view of FIG. 6.
Figure 8:
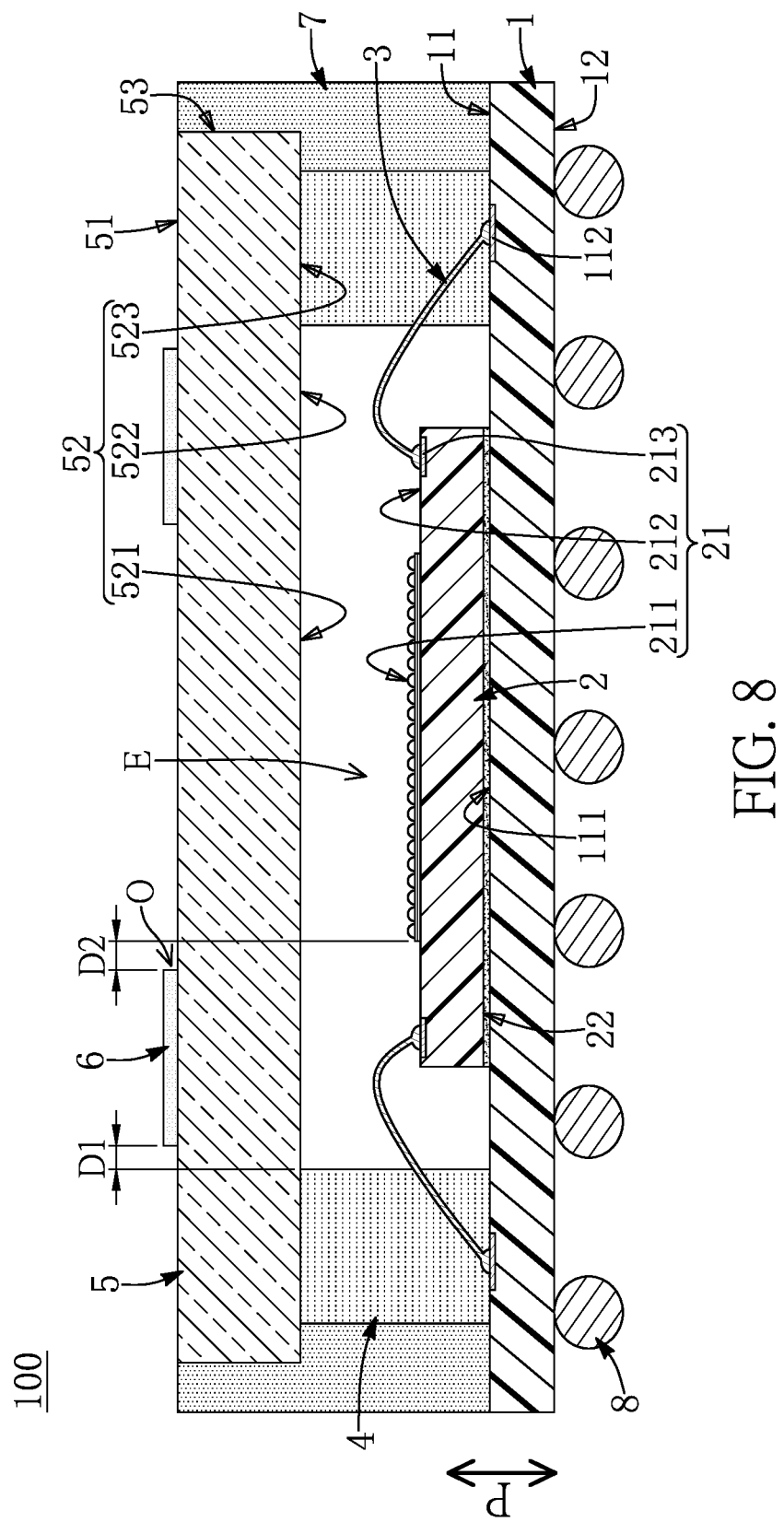
FIG. 8 is a cross-sectional view taken along line VIII-VIII of FIG. 7.
Figure 9:
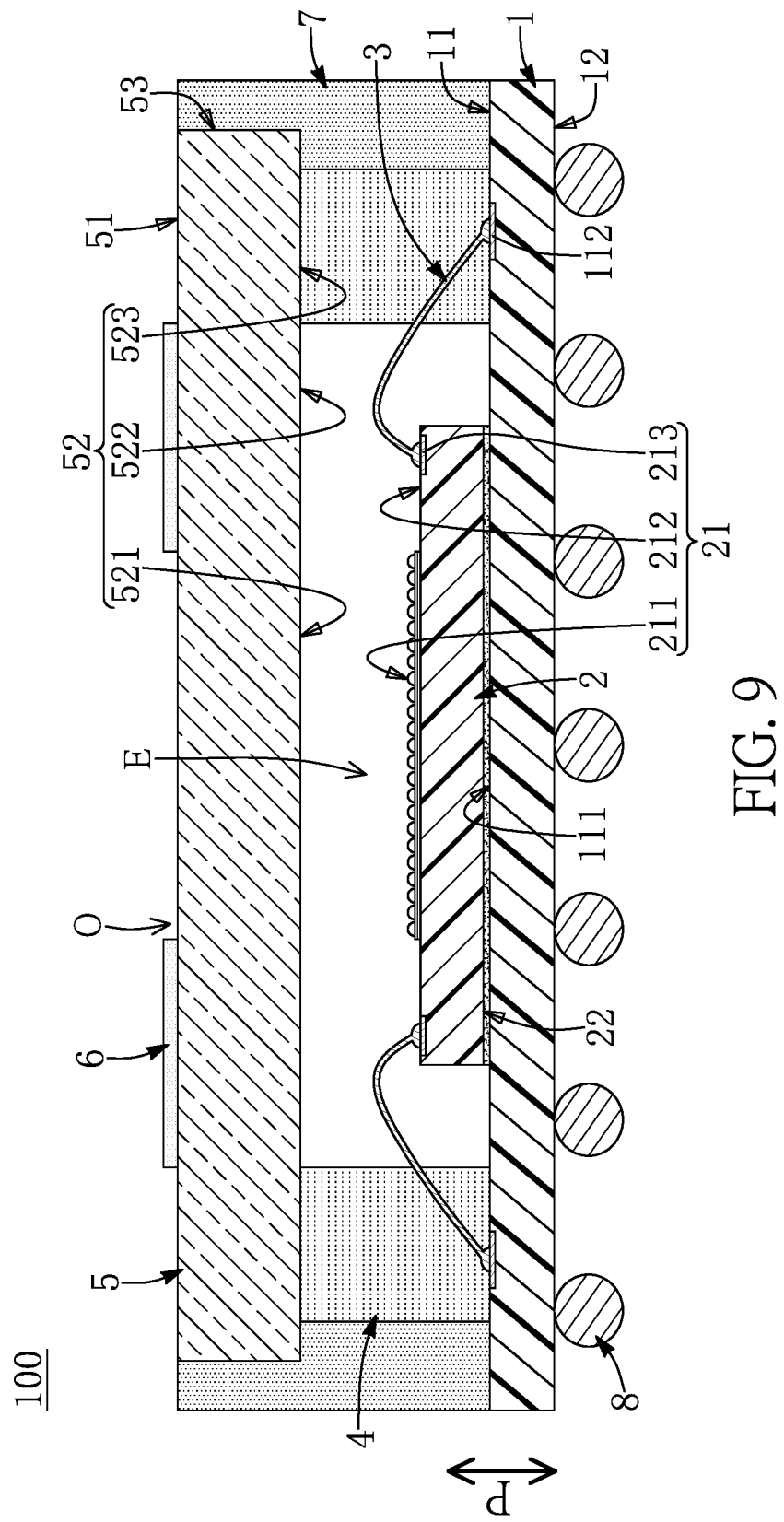
FIG. 9 is a cross-sectional view showing the sensor package structure in another configuration according to the second embodiment of the present disclosure.

Specifically, the light-curing layer 4 can be disposed on the soldering pads 112. In other words, each (or at least one) of the soldering pads 112 and a part of the corresponding metal wire 3 connected thereto are embedded in the light-curing layer 4, thereby reducing the size of the sensor package structure 100, but the present disclosure is not limited thereto. For example, as shown in FIG. 5, each (or at least one) of the soldering pads 112 and a part of the corresponding metal wire 3 connected thereto can be located inside of and not in contact with the light-curing layer 4.

In addition, the light-curing layer 4 of the present embodiment is a structure that can be cured by being irradiated with light (e.g., ultraviolet light). Accordingly, any adhesive layer not cured by being irradiated with light is different from the light-curing layer 4 of the present embodiment.

As shown in FIG. 2 to FIG. 4, the light-permeable layer 5 in the present embodiment is a transparent and flat glass board, but the present disclosure is not limited thereto. The light-permeable layer 5 is arranged above the sensor chip 2 by being disposed on the light-curing layer 4; in other words, the light-curing layer 4 is sandwiched between the light-permeable layer 5 and the substrate 1.

The light-permeable layer 5 in the present embodiment has an outer surface 51, an inner surface 52 that is opposite to the outer surface 51, and a surrounding lateral surface 53 that connects the outer surface 51 and the inner surface 52. Moreover, the inner surface 52 has a light-permeable region 521, a distribution region 522 being ring-shaped and surrounding the light-permeable region 521, and an assembling region 523 that is ring-shaped and that surrounds the distribution region 522. The assembling region 523 is connected to the surrounding lateral surface 53.

The light-permeable layer 5 is disposed on the light-curing layer 4 through the assembling region 523 so as to be located above the sensor chip 2. The inner surface 52 of the light-permeable layer 5, the light-curing layer 4, and the substrate 1 jointly define an enclosed space E. The sensor chip 2 is arranged in the enclosed space E, and the sensing region 211 faces toward the light-permeable region 521.

The shielding layer 6 is ring-shaped and is disposed on the light-permeable layer 5 so as to block a visible light from passing there-through. In the present embodiment, the shielding layer 6 is configured to only allow an infrared light having a wavelength of at least 780 nm to pass there-through, and the shielding layer 6 is configured to block a light having a wavelength less than 780 nm from passing there-through. In addition, the connection pads 213 and at least part of each of the metal wires 3 are located in a projection space defined by orthogonally projecting the shielding layer 6 toward the substrate 1 along the predetermined direction P.

Specifically, the shielding layer 6 is arranged in the enclosed space E and is formed on the inner surface 52 of the light-permeable layer 5. A first projection area defined by orthogonally projecting the shielding layer 6 onto the inner surface 52 along the predetermined direction P does not overlap the assembling region 523. In other words, the shielding layer 6 is arranged inside of the light-curing layer 4 and is not embedded in the light-curing layer 4. Moreover, a second projection area defined by orthogonally projecting the sensing region 211 onto the inner surface 52 along the predetermined direction P does not overlap the first projection area and is located inside of the first projection area. In other words, an inner edge of the shielding layer 6 has an opening O located directly above the sensing region 211.

In summary, the shielding layer 6 can be formed on the distribution region 522 of the inner surface 52 of the light-permeable layer 5 according to design requirements. In the present embodiment, a first distance D1 between an outer edge of the shielding layer 6 and the light-curing layer 4 is preferably within a range from 0 to 50 μm, and a second distance D2 between the second projection area and the inner edge of the shielding layer 6 is preferably within a range from 0 to 50 μm, but the present disclosure is not limited thereto.

The package body 7 in the present embodiment is opaque for blocking a visible light from passing there-through. The package body 7 is a molding compound formed on the upper surface 11 of the substrate 1, and an edge of the package body 7 is flush with that of the substrate 1. The light-curing layer 4 and the light-permeable layer 5 are embedded in the package body 7, at least part of the outer surface 51 of the light-permeable layer 5 is exposed from the package body 7, and at least 95% area of the surrounding lateral surface 53 and a part of the assembling region 523 are connected to and are covered by the package body 7, but the present disclosure is not limited thereto.

In summary, the sensor package structure 100 in the present embodiment can simultaneously have or achieve a plurality of technical effects described in the next paragraph through the structural cooperation of the components thereof. In other words, any package structure not simultaneously achieving the above technical effects is different from the sensor package structure 100 of the present embodiment.

Specifically, under the premise that the shielding layer 6 of the sensor package structure 100 is used to block a visible light for reducing the flare phenomenon caused by light reflected from the light-curing layer 4, the shielding layer 6 does not affect a curing process of the light-curing layer 4, and delamination does not occur between the shielding layer 6 and the light-curing layer 4, thereby effectively increasing the production yield of the sensor package structure 100. Moreover, since the shielding layer 6 is configured to only allow an infrared light to pass there-through, the sensor package structure 100 can be detected by the infrared light (e.g., the shape of the light-curing layer 4 can be detected by the infrared light).

Second Embodiment

Referring to FIG. 6 to FIG. 9, a second embodiment of the present disclosure is provided, which is similar to the first embodiment of the present disclosure. For the sake of brevity, descriptions of the same components in the first and second embodiments of the present disclosure will be omitted herein, and the following description only discloses different features between the first and second embodiments.

In the present embodiment, the shielding layer 6 is arranged outside of the enclosed space E and is formed on the outer surface 51. Specifically, a first projection area defined by orthogonally projecting the shielding layer 6 onto the inner surface 52 along the predetermined direction P does not overlap the assembling region 523. In the present embodiment, a first distance D1 between an outer edge of the first projection area and the assembling region 523 is within a range from 0 to 50 μm, and a second distance D2 between the second projection area and an inner edge of the first projection area is within a range from 0 to 50 μm.

Beneficial Effects of the Embodiments

In conclusion, the sensor package structure provided by the present disclosure can simultaneously have or achieve a plurality of technical effects through the structural cooperation of the components thereof (e.g., under the premise that the shielding layer is used to block a visible light for reducing the flare phenomenon caused by light reflected from the light-curing layer, the shielding layer does not affect a curing process of the light-curing layer, and delamination does not occur between the shielding layer and the light-curing layer, thereby effectively increasing the production yield of the sensor package structure).

Moreover, since the shielding layer of the sensor package structure provided by the present disclosure is configured to only allow an infrared light to pass there-through, the sensor package structure can be detected by the infrared light.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
a substrate;

a sensor chip disposed on the substrate along a predetermined direction, wherein the sensor chip is electrically coupled to the substrate, and a top surface of the sensor chip has a sensing region;

a light-curable layer being ring-shaped, wherein the light-curable layer is disposed on the substrate and surrounds the sensor chip;

a light-permeable layer having an outer surface and an inner surface, wherein the inner surface has an assembling region being ring-shaped, wherein the assembling region of the light-permeable layer is disposed on the light-curable layer, and the light-permeable layer is located above the sensor chip, and wherein the inner surface of the light-permeable layer, the light-curable layer, and the substrate jointly define an enclosed space, and the sensor chip is arranged in the enclosed space; and a shielding layer being ring-shaped, wherein the shielding layer is disposed on the inner surface of the light-permeable layer and is arranged in the enclosed space so as to block visible light from passing there-through, wherein an outer edge of the shielding layer is spaced apart from the light-curable layer, wherein a first projection area defined by orthogonally projecting the shielding layer onto the inner surface along the predetermined direction does not overlap the assembling region and is located inside of the assembling region, and wherein a second projection area defined by orthogonally projecting the sensing region onto the inner surface along the predetermined direction does not overlap the first projection area and is located inside of the first projection area;

wherein the substrate includes a plurality of soldering pads arranged outside of the sensor chip, the sensor chip includes a plurality of connection pads arranged outside of the sensing region, and the sensor package structure includes a plurality of metal wires each having a first end and a second end, and wherein the first ends of the metal wires are respectively connected to the soldering pads, and the second ends of the metal wires are respectively connected to the connection pads;

wherein the connection pads are located in a projection space defined by orthogonally projecting the shielding layer toward the substrate along the predetermined direction.

2. The sensor package structure according to claim 1, wherein at least one of the soldering pads and a part of the corresponding metal wire connected thereto are embedded in the light-curable layer.

3. The sensor package structure according to claim 1, wherein at least one of the soldering pads and a part of the corresponding metal wire connected thereto are located inside of and not in contact with the light-curable layer.

4. The sensor package structure according to claim 1, wherein the shielding layer is configured to only allow infrared light having a wavelength of at least 780 nm to pass there-through, and the shielding layer is configured to block light having a wavelength less than 780 nm from passing there-through.

5. The sensor package structure according to claim 1, wherein a first distance between the outer edge of the shielding layer and the light-curable layer is greater than 0 and less than 50 μm, and a second distance between the second projection area and an inner edge of the shielding layer is within a range from 0 to 50 μm.

6. The sensor package structure according to claim 1, further comprising a package body formed on the substrate, wherein the light-curable layer and the light-permeable layer are embedded in the package body, and at least part of the outer surface of the light-permeable layer is exposed from the package body.

7. The sensor package structure according to claim 6, wherein the light-curable layer is an ultraviolet (UV) light curing layer, the package body is opaque for blocking visible light from passing there-through, and the light-permeable layer has a surrounding lateral surface that connects the outer surface and the assembling region of the inner surface, and wherein at least 95% area of the surrounding lateral surface and a part of the assembling region are connected to and are covered by the package body.

\* \* \* \* \*